United States Patent [19]

Covell, II et al.

[11] Patent Number: 5,961,032
[45] Date of Patent: Oct. 5, 1999

[54] METHOD OF FABRICATION OF A MULTI-COMPONENT SOLDER COLUMN BY BLOCKING A PORTION OF A THROUGH HOLE IN A MOLD

[75] Inventors: James H. Covell, II, Poughkeepsie; Shaji Farooq, Hopewell Junction; Peter A. Gruber, Mohegan Lake; Sudipta K. Ray, Wappingers Falls, all of N.Y.

[73] Assignee: International Business Machines Corporation, Armonk, N.Y.

[21] Appl. No.: 08/884,977

[22] Filed: Jun. 30, 1997

[51] Int. Cl.[6] ............... B23K 35/012; B23K 31/002; B22C 9/020
[52] U.S. Cl. ............ 228/254; 228/226; 228/180.22; 249/119
[58] Field of Search ................... 228/254, 226, 228/180.22, 56.3; 427/96, 123, 282; 249/119

[56] References Cited

U.S. PATENT DOCUMENTS

| | | | |
|---|---|---|---|
| 3,934,810 | 1/1976 | Henning | 249/117 |
| 4,263,341 | 4/1981 | Martyniak . | |
| 5,086,967 | 2/1992 | Delalle et al. | 228/56.3 |
| 5,244,143 | 9/1993 | Ference et al. | 228/180.21 |
| 5,350,105 | 9/1994 | Delalle et al. | 228/56.3 |
| 5,439,162 | 8/1995 | George et al. | 228/180.22 |
| 5,673,846 | 10/1997 | Gruber | 228/180.22 |
| 5,718,361 | 2/1998 | Braun et al. | 228/56.3 |
| 5,718,367 | 2/1998 | Covell, II et al. | 228/254 |
| 5,762,259 | 6/1998 | Hubacher et al. | 228/180.22 |
| 5,775,569 | 7/1998 | Berger et al. | 228/254 |
| 5,806,753 | 9/1998 | Bielick et al. | 228/248.1 |
| 5,820,894 | 10/1998 | Kreutzer | 425/389 |

*Primary Examiner*—Patrick Ryan
*Assistant Examiner*—Carlos J. Gamino
*Attorney, Agent, or Firm*—DeLio & Peterson LLC; John J. Tomaszewski; Aziz M. Ahsan

[57] ABSTRACT

A method is described for forming solder mounds for attachment to electronic devices. The solder mounds are preferably in the form of columns and comprise a first solder portion and a second solder portion with the two solder portions having different melting points. The solder columns are preferably formed using an injection molding device. The method is directed to the use of a single column mold to form the multi-solder column. In one embodiment, deformable material is used to partially block a portion of the through opening of the mold during a first solder injection process. The deformable material is then removed and the remainder of the through openings of the mold filled with a second molten solder. The multi-solder column is then electrically connected to a substrate by reflowing.

6 Claims, 5 Drawing Sheets

METHOD OF FABRICATION OF A MULTI-COMPONENT SOLDER COLUMN BY BLOCKING A PORTION OF A THROUGH HOLE IN A MOLD

BACKGROUND OF THE INVENTION

1. Field of the Invention

This invention relates generally to electrically connecting one electronic component to another electronic component and, in particular, to providing solder mounds in the form of columns which are connected to the bottom surface metallurgy pads of an electronic component such as a multilayer ceramic package, which component may then be electrically connected to another component.

2. Description of Related Art

Forming an electronic package whereby an electrical component such as a multilayer ceramic package is electrically connected to a substrate such as a card, a board, another connector or any other electronic part is well-known in the art. Surface mount technology (SMT) has gained acceptance as the preferred means of joining electronic devices together, particularly in high end computers. As circuit densities increase there is an increased demand for more I/O and the interconnections which are solder bonded must be smaller and more closely spaced. Additionally, the height of each interconnection must be distributed within a relatively small height tolerance to insure that all of the multilayer ceramic package locations will be electrically interconnected to a corresponding substrate contact location through the solder interconnections.

A myriad of solder structures have been proposed for surface mounting of one electronic structure to another. A typical surface mount process is performed by screening solder paste on conductive, generally metallic pads exposed on a surface of a first electronic structure or substrate. stencil printing operation is used to align a contact mask to the pads. Other known surface mount technology uses solder balls rather than solder paste to provide the solder connecting structures. This technology is known as C-4 and by using solder balls, a more exact and somewhat greater quantity of solder can be applied then through screening. These type structures are used mainly to connect a chip to a multilayer ceramic package.

Another type of solder interconnection is a cast solder column which is mainly used to connect a multilayer ceramic package to a board. Cast columns (CGA) are preferred over pin grid arrays (PGA) in that the nature of the joint (solder connection) offers a better electrical connection over the PGA, is less expensive to manufacture and compensates for thermal expansion differences between the ceramic package and the board. In general, pins are prefabricated and then attached to the bottom side of the package substrate. Sockets are attached to the board where the PGA is plugged in. The PGA process is costly compared to the CGA cast column process.

In the present wire column grid array process a eutectic paste is screened on the substrate pads, typically the bottom surface metallurgy (BSM) pads. The solder columns are loaded separately into a mold or formed in the mold and then aligned to the substrate BSM pads and reflowed. This two-step procedure leads to increased manufacturing cost and possible misalignment of columns to the BSM pads.

One method of forming solder mounds (e.g., columns, etc.) is shown in U.S. Pat. No. 5,244,143, to Ference et al. and assigned to the assignee of the present invention, the disclosure of which is hereby incorporated by reference. The patent discloses an apparatus and method for injection molding solder mounds onto transfer backing plates or electronic devices. In general, the apparatus has a reservoir for molten solder which is disposed over a cavity in an injection plate. The injection plate is disposed over a mold having an array of cavities therein into which solder is injection molded. The mold is typically disposed over a workpiece such as a multilayer ceramic substrate and the cavities in the mold are aligned with electrical contact locations on the substrate. The workpiece is heated and the molten solder is forced under gas pressure into the cavity in the injection plate disposed above the array of cavities in the mold and the molten solder is forced into the cavities. In one embodiment, the injection plate is advanced to slide over the stationary mold to wipe away the excess solder above the mold at a plurality of wiping apertures in the injection plate. The injection plate is then further advanced to a location having a nonsoldered wettable surface at which location the injection plate is removed. The mold is then removed to leave solder mounds disposed on the workpiece.

Bearing in mind the problems and deficiencies of the prior art, it is an object of the present invention to provide a method for molding solder mounds (columns) and to forming solder columns on a substrate for electrically connecting the substrate to another electronic component. The solder columns have layers of one or more different melting point solders.

It is a further object of the present invention to provide an apparatus to fabricate a solder mound (column) in a mold and to fabricate a solder column on an electronic component.

It is another object of the invention to provide a solder mound and in particular a solder column having one or more layers of different melting point solders which mounds and columns may be used to provide interconnection between two electronic components without the need for a solder paste.

Other objects and advantages of the present invention will in part be readily apparent from the following description.

SUMMARY OF THE INVENTION

The above and other objects, which will be apparent to those skilled in the art, are achieved in the present invention which is directed to, in a first aspect, a method for molding solder mounds in a single mold with the solder mounds comprising a solder column having at least two (2) separate solder portions with each solder portion having different melting points. The solder columns are typically in an array and may be electrically connected to the pads or other terminals of an electronic component in a single melting or reflow step which connected columns may then be interconnected to another electronic component. In general, the mold comprises a plurality of through openings which through openings are partially blocked so that when a first molten solder is cast in the mold the solder partially fills the through opening in the mold. After solidification, the blocking means is removed from the mold and the mold usually inverted so that the open portion of the mold is facing upwards and the remainder of the through opening is then filled with a second molten solder to substantially fill the through opening. The side of the mold having the lower melting point solder is then typically placed adjacent to a substrate to which the column is to be connected and the mold heated above the melting point of the lower melting pond solder to bond the solder to the substrate and then cooled and the mold is removed leaving the column from the mold electrically connected to the substrate. The substrate may be any type electronics substrate such as a multilayer ceramic substrate, epoxy laminate, chip (die) or other such device.

In a preferred method for molding solder mounds and, in particular, to forming the solder columns on a substrate, the method comprises the steps of:

provcolumn extending from the upper surface to the lower surface of said mold;

positioning the mold so the through openings at the upper surface remain open and the lower surface is adjacent a blocking means for blocking a portion of the through opening;

forcing a first molten solder having a first melting point into the through opening from the upper surface and filling the through opening except for the portion which is blocked by the blocking means;

solidifying the first solder;

removing the blocking means, preferably inverting the mold, and forcing a second molten solder having a second melting point into the through opening from the lower surface filling the remainder of the through opening;

solidifying the second solder;

positioning the surface of the mold containing the lower melting point solder adjacent the substrate;

heating the mold so the lower melting point solder melts;

bonding the substrate and the solder column;

cooling the mold;

removing the mold leaving the solder mound on the surface of the substrate.

In another aspect of the invention, the mold has a plurality of openings which correspond to the pads or other connections of a substrate to which the columns are to be electrically connected. The first solder and the second solder will typically have different melting points with the lower melting point portion of the solder column being reflowed and forming the connection of the solder mound to the substrate.

In another preferred aspect of the invention, the blocking means comprises a deformable material wherein when the mold is forced against the deformable material, the deformable material partially fills the mold openings blocking a portion of the through opening. Preferably, the blocking means comprises a carrier having a cavity sized to accommodate the mold openings and the deformable material and the mold is forced against the deformable material to partially block the through openings.

In another aspect of the invention, the blocking means comprises a carrier having a flexible membrane on the upper surface thereof which membrane may be deformed by, e.g., air or other gas communicating with a conduit in the carrier, so that when the mold is placed adjacent the carrier, air or another gas introduced into the carrier will force the membrane into openings in the mold thereby blocking a portion of the through openings in the mold.

In a further aspect of the invention, the blocking means may comprise a carrier having a plurality of protuberances on the surface of the carrier which protuberances correspond to openings in the mold so that when the mold and carrier are placed in registration the protuberances partially fill the through openings of the mold.

In the further aspect of the invention, an apparatus for molding solder mounds such as solder columns on a substrate is provided comprising:

a mold having at least one through opening extending from the upper surface to the lower surface of the mold;

first blocking means for partially blocking the through opening;

first filling means for filling the blocked through opening with a first molten solder having a first melting point and solidifying the molten solder;

means for removing the first blocking means;

second filling means for filling the remainder of the through opening with a second molten solder having a second melting point to completely fill the through opening and solidifying the second molten solder;

means for positioning the surface of the mold containing the lower melting point solder adjacent the substrate; and means for heating the mold and substrate so the lower melting point solder melts and forms a bond between the substrate and solder mound;

means for cooling the mold; and means for removing the mold leaving the solder mound on the substrate.

In a more particular aspect of the invention, an injecting molding apparatus and method as shown in U.S. Pat. No. 5,244,143, supra, are used to fill the mold openings with molten solder.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
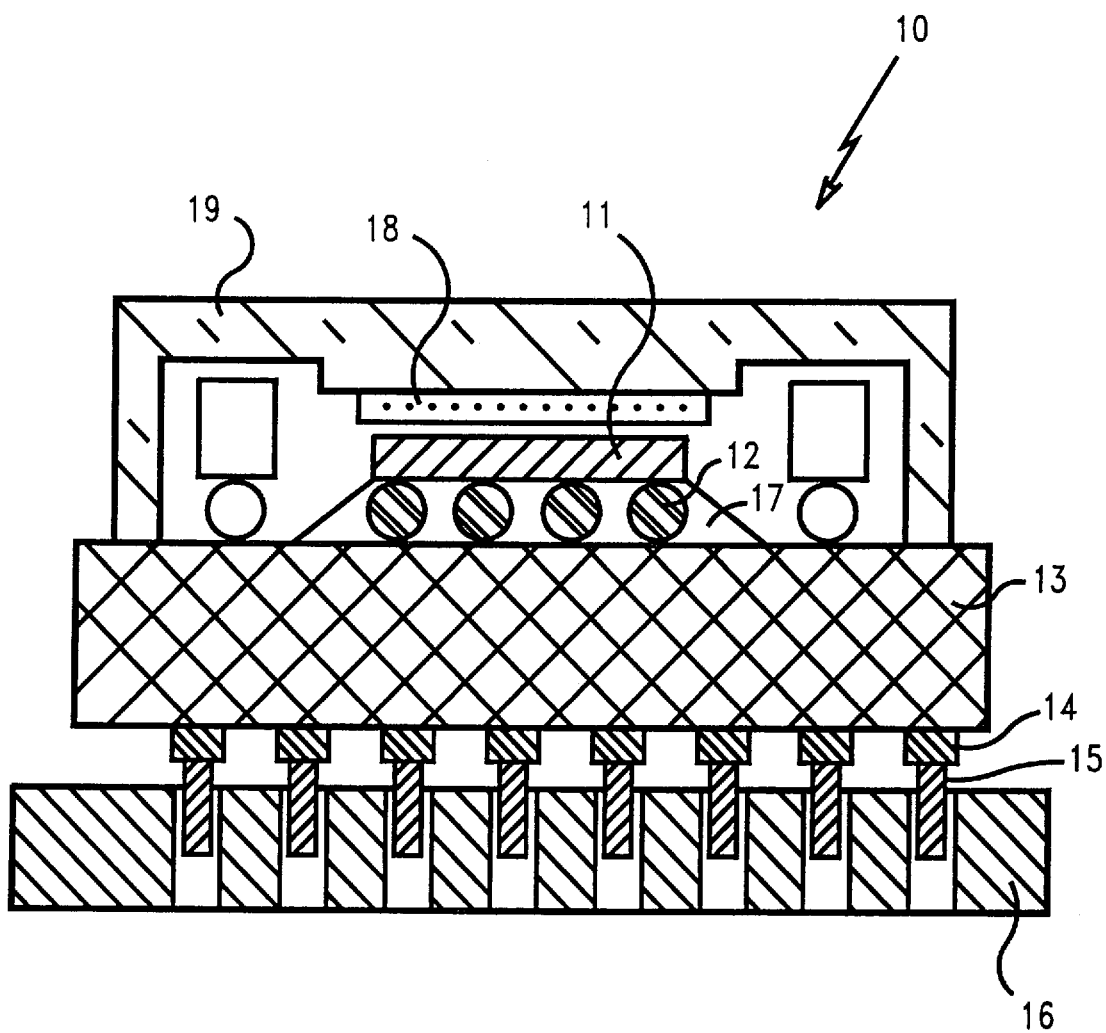
FIG. 1 is a partial cross-sectional view of an electronic component substrate having solder columns attached thereto from a mold according to the apparatus and method of the invention.

In describing the preferred embodiment of the present invention, reference will be made herein to FIGS. 1–5 of the drawings in which like numerals refer to like features of the invention. Features of the invention are not necessarily shown to scale in the drawings.

Referring to FIG. 1, an electronic component is shown generally as 10. The component comprises chip 11 electrically connected to a substrate 13 by C4 bumps 12. The bumps are enclosed by an encapsulant 17 which is typically an epoxy material. A cooling surface is shown as 18 and the chip is totally encapsulated to the substrate by cap 19. The substrate 13 which is typically a multilayer ceramic package is shown as having a bottom surface metallurgy (BSM) pads 14. A mold 16 having solid solder columns 15 therein is shown partially removed from the lower surface of substrate 13 and pads 14. After reflow and subsequent cooling, the mold will be moved away from the electronic component 10 leaving the columns 15 electrically and fixedly connected to substrate 13 and BSM 14.

Figure 2A:
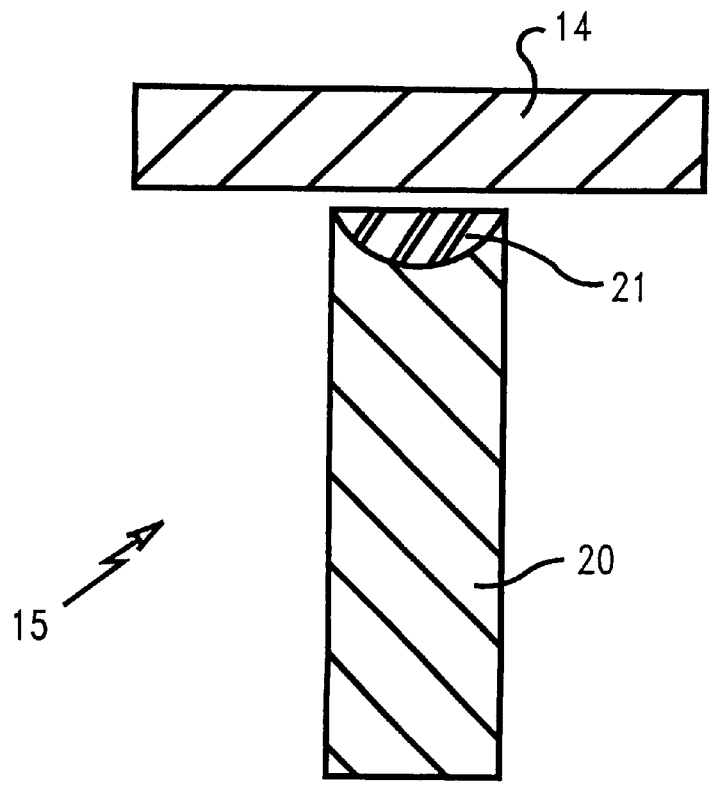
FIGS. 2A and 2B show a solder column of the invention before reflow connection to a BSM pad and after reflow connection to a BSM pad respectively.
Figure 2B:
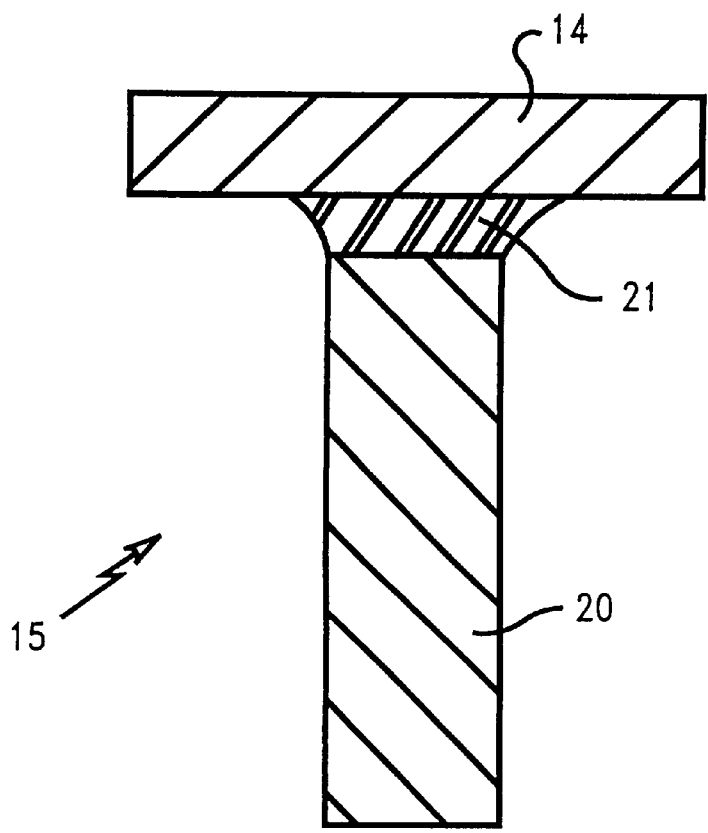

Referring to FIG. 2A, the solder column 15 of FIG. 1 is shown in more detail. Accordingly, before reflow the column 15 comprising a first solder component 20 and a second solder component 21 is shown positioned adjacent to BSM 14 with second solder component 21 positioned proximate to BSM 14. FIG. 2B shows the column 15 electrically and fixedly connected to BSM 14 after reflow with second solder 21 electrically and mechanically connecting BSM 14 and first solder 20 of solder column 15. Second solder component 21 has a lower melting point than first solder component 20.

Figure 3A:
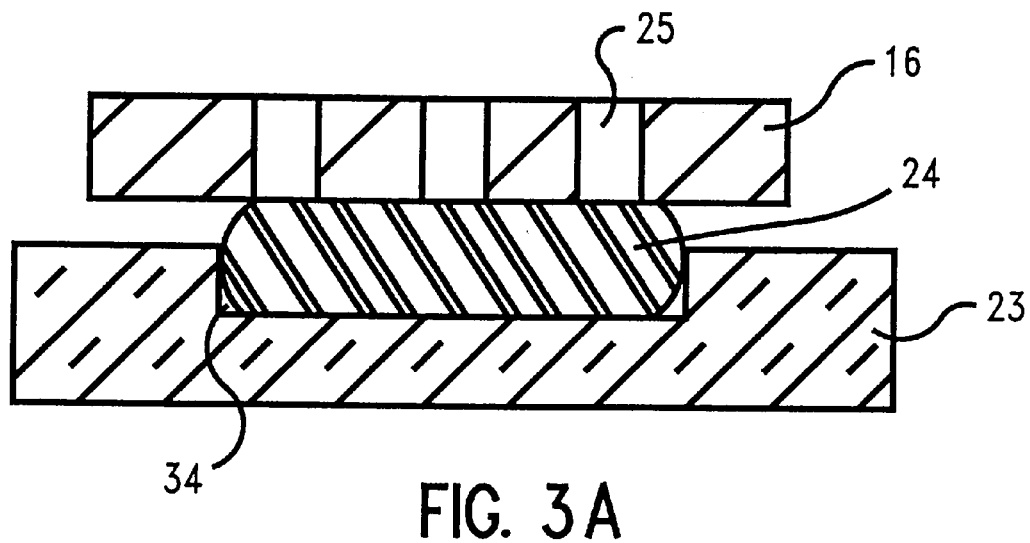
FIGS. 3A–3E show a series of steps for forming in a single mold a multi-solder containing solder column and attachment of the column to a substrate using the method and apparatus of the invention.
Figure 3B:
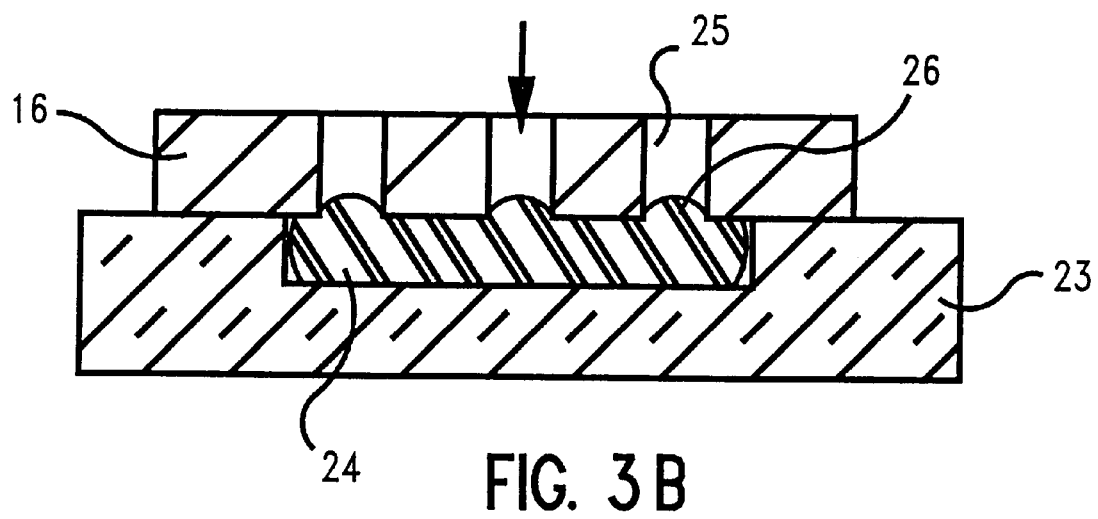

FIGS. 3A–3E show a series of steps whereby a single mold is employed to form a multi-component solder column for attachment to a substrate. In FIG. 3A, a mold 16 having through openings 25 therein is placed over carrier 23 having a deformable material 24 disposed in an opening 34 in the carrier. In FIG. 3B, the mold 16 is shown pushed down to the upper surface of carrier 23 and onto to the deformable material 24. The deformable material 24 is deformed and the deformable material forms bumps 26 which partially block through openings 25.

Figure 3C:
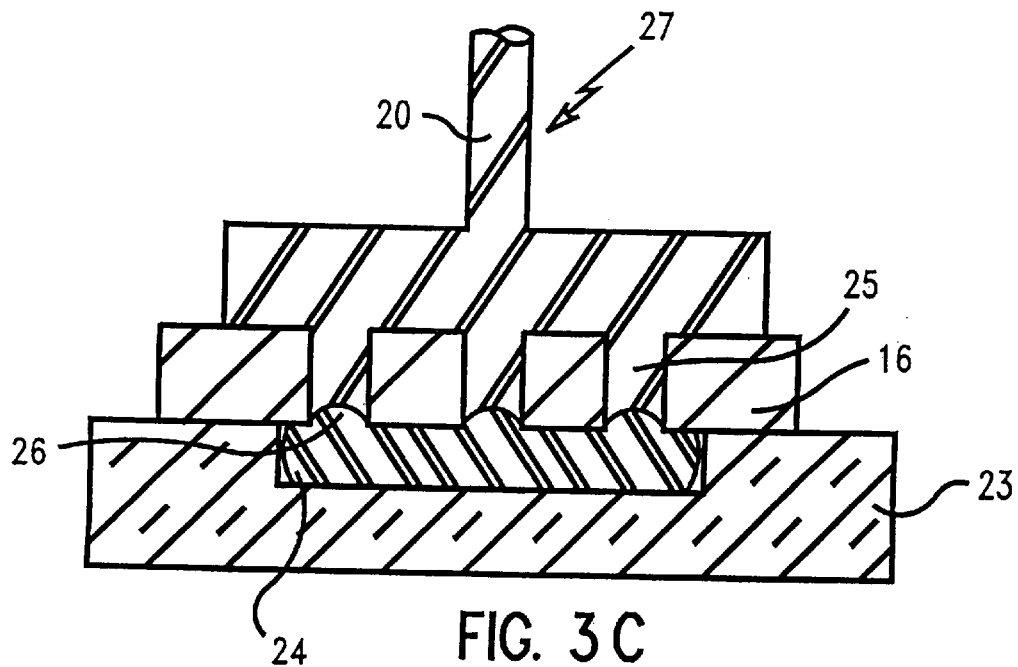
Figure 3D:
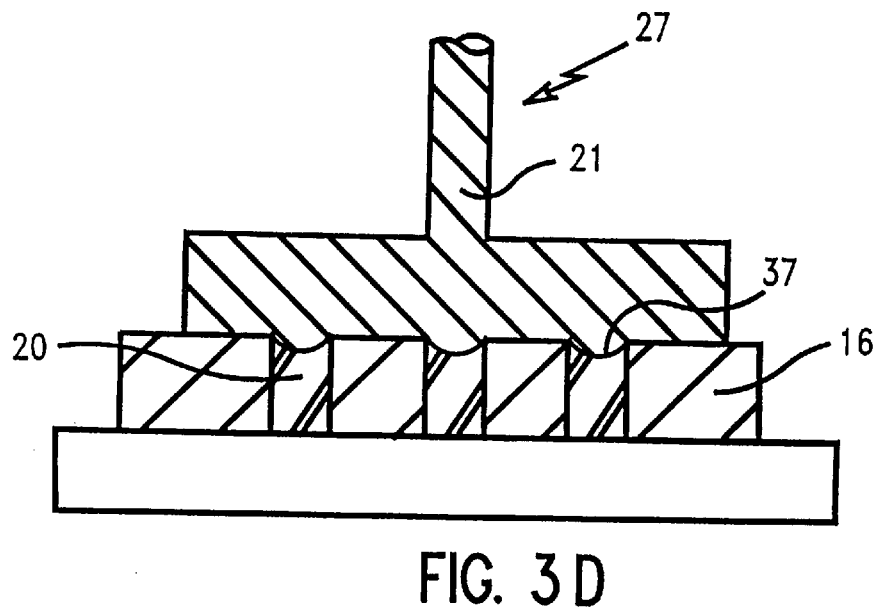
Figure 3E:
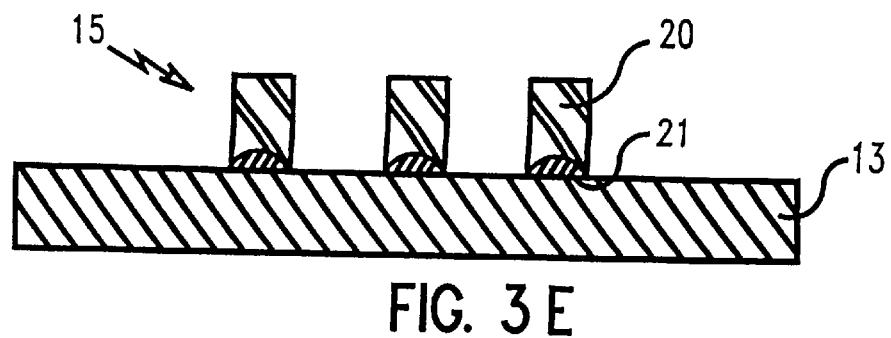

In FIG. 3C, the use of an injection means 27 is schematically shown forcing a first solder 20 into blocked openings 25 partially filling the through openings 25. The through openings 25 are only partially filled with molten solder because of bumps 26 blocking a portion of the through opening. In FIG. 3D, the mold 16 is shown flipped 180 degrees so that the unfilled portions 37 of through openings 25 are upward facing the solder injection means 27. A second solder 21 is shown filling portions 37 and the through opening 25 completely to the surface of mold 16. In FIG. 3E the solder columns are shown positioned and formed on a substrate 13 after the solder columns have been removed from the mold and after reflow. The second solder 21 is proximate the surface of substrate 13 and forms a mechanical and electrical connection between substrate 13 and second solder 20. The BSM 14 is not shown in the drawing in the figure for clarity.

Figure 4:
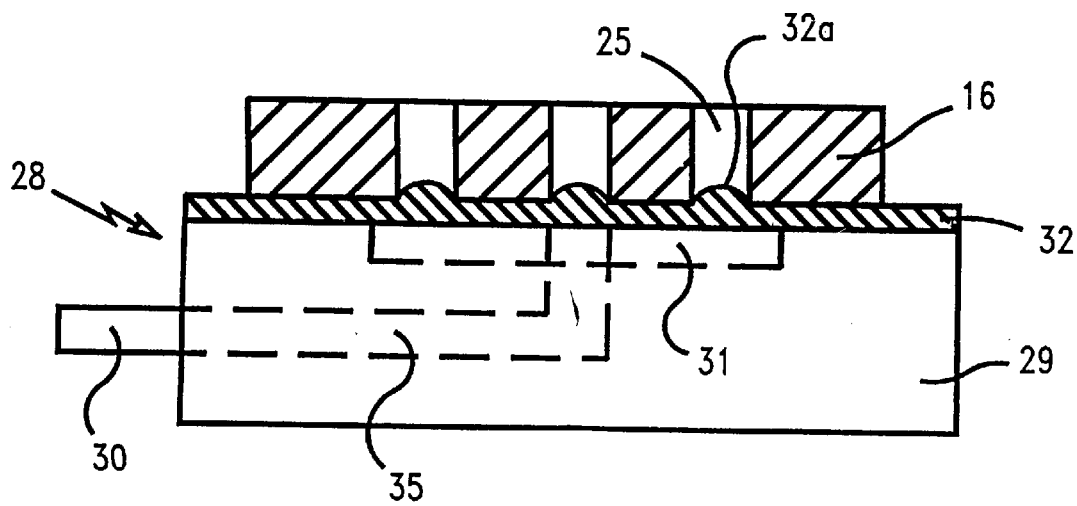
FIGS. 4 and 5 show partial cross-sectional views of means for partially blocking the through openings of a mold for forming the solder column of the invention.

Referring to FIG. 4, another blocking carrier 28 useful with the invention is shown. Blocking carrier 28 has a base 29 and an opening 30. The opening 30 is connected by a conduit 35 to an opening manifold 31 which communicates with deformable carrier membrane 32. When the mold 16 is disposed on top of membrane 32 and a pressure force such as a gas applied to opening 30, the deformable membrane 32 forms bumps 32a in through opening 25 of mold 16. Referring back to FIGS. 3C–3E it can be seen how a first solder and a second solder may be filled in through opening 25 to form a multi-solder column of the invention.

Figure 5:
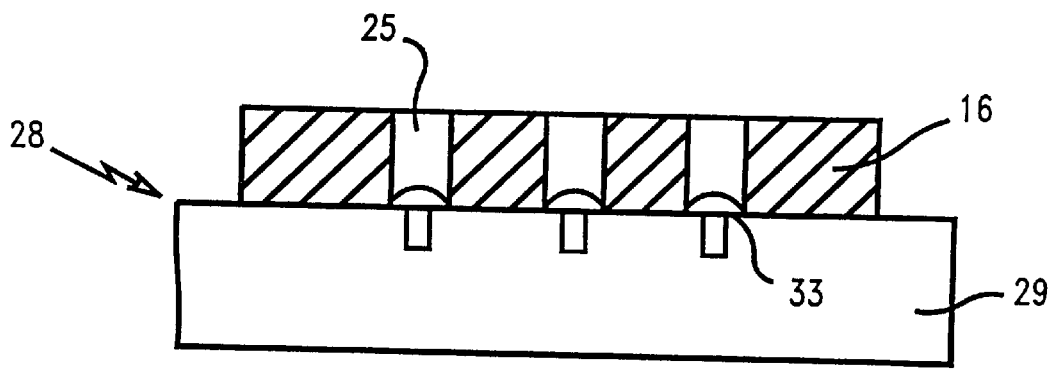

Similarly, in FIG. 5, a blocking carrier 28 is shown having a carrier base 29 and integral protuberances, preferably solid, 33, thereon in the form of semicircular shapes. The protuberances 33 are spaced on carrier 19 to correspond to the through openings 25 in mold 16 so that when mold 16 is registered with carrier base 29, the protuberances 33 block a portion of through opening 25. As with the carrier shown in FIG. 4, the through openings 25 may be filled with a first solder and a second solder as shown as using the procedures shown in FIGS. 3C–3E.

With regard to the apparatus and method shown in FIGS. 3A–3E, the deformable material 24 is preferably a thermally stable putty which will not degrade during injection molding of molten solder in the mold opening 25. Likewise, the membrane 32 shown in FIG. 4 will likewise be a thermally stable material. A deformable membrane material 32 may be selected from a polymide such as KAPTON made by Dow Corning, Teflon, stainless steel bellows, or other such deformable thermally resistant material. The deformable material 24 is of a putty like consistency and may be selected from expanded Teflon, sealed silicon foam, low durometer (about 30) silicon rubber and any such compressible material.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention,

What is claimed is:

1. A method for molding solder columns and forming the solder columns on a substrate, the method comprises the steps of:

providing a mold having at least one through opening extending from the upper surface to the lower surface of said mold;

positioning the mold so the through openings at the upper surface remain open and the lower surface is adjacent to a blocking means for blocking a portion of the through opening;

forcing a first molten solder having a first melting point into the through openings by a forcing means from the upper surface and filling the through opening except for the portion which is blocked by the blocking means;

solidifying the first solder;

removing the blocking means and forcing a second molten solder having a second melting point into the through openings from the lower surface filling the remainder of the through openings with the second solder;

solidifying the second solder;

positioning the surface of the mold containing the lower melting point solder adjacent to the substrate;

heating the substrate and mold so that the lower melting point solder melts;

bonding the substrate and the solder column;

cooling the mold; and removing the mold leaving the solder columns on the surface of the substrate.

2. The method of claim 1 wherein the substrate is a multilayer ceramic electronic component package.

3. The method of claim 2 wherein the forcing means is a solder injection molding apparatus.

4. The method of claim 1 wherein the blocking means is a deformable putty.

5. The method of claim 1 wherein the blocking means is a deformable membrane.

6. The method of claim 1 wherein the blocking means comprises a carrier base having protuberances therein which protuberances correspond to openings in the mold.

* * * * *